US007014669B2

(12) United States Patent
Small et al.

(10) Patent No.: US 7,014,669 B2
(45) Date of Patent: *Mar. 21, 2006

(54) CATALYTIC COMPOSITION FOR CHEMICAL-MECHANICAL POLISHING, METHOD OF USING SAME, AND SUBSTRATE TREATED WITH SAME

(75) Inventors: Robert J. Small, Dublin, CA (US); Brandon S. Scott, Castro Valley, CA (US)

(73) Assignee: DuPont Air Products NanoMaterials LLC, Tempe, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/619,708

(22) Filed: Jul. 14, 2003

(65) Prior Publication Data

US 2004/0029495 A1 Feb. 12, 2004

Related U.S. Application Data

(63) Continuation of application No. 10/074,757, filed on Feb. 11, 2002, now abandoned.

(51) Int. Cl.
C09G 1/02 (2006.01)
C09G 1/04 (2006.01)
B24B 1/00 (2006.01)

(52) U.S. Cl. .......................... 51/307; 51/308; 51/309; 106/3; 438/692; 438/693

(58) Field of Classification Search .................. 51/307, 51/308, 309; 106/3; 438/692, 693
See application file for complete search history.

(56) References Cited

U.S. PATENT DOCUMENTS

| | | | |
|---|---|---|---|
| 3,139,406 A | 6/1964 | Mindick et al. | |
| 4,252,671 A | 2/1981 | Smith | |
| 4,478,742 A | 10/1984 | Payne | |
| 4,959,113 A | 9/1990 | Roberts | |
| 5,084,071 A | 1/1992 | Nenadic et al. | |
| 5,225,034 A | 7/1993 | Yu et al. | |
| 5,234,880 A | 8/1993 | Cook et al. | |
| 5,302,356 A * | 4/1994 | Shadman et al. | 422/186.3 |
| 5,340,370 A | 8/1994 | Cadien et al. | |
| 5,527,423 A | 6/1996 | Neville et al. | |
| 5,735,963 A | 4/1998 | Obeng | |
| 5,785,868 A | 7/1998 | Li et al. | |
| 5,948,697 A | 9/1999 | Hata | |
| 5,958,228 A | 9/1999 | Tokushima et al. | |
| 5,958,288 A | 9/1999 | Mueller et al. | |
| 5,958,794 A | 9/1999 | Bruxvoort et al. | |
| 5,976,480 A | 11/1999 | Mangold et al. | |
| 5,980,775 A | 11/1999 | Grumbine et al. | |
| 5,997,620 A | 12/1999 | Kodama et al. | |
| 6,022,400 A | 2/2000 | Izumi et al. | |
| 6,030,425 A | 2/2000 | Hata | |
| 6,068,787 A | 5/2000 | Grumbine et al. | |
| 6,117,775 A | 9/2000 | Kondo et al. | |
| 6,140,239 A | 10/2000 | Avanzino et al. | |
| 6,159,076 A | 12/2000 | Sun et al. | |
| 6,177,026 B1 | 1/2001 | Wang et al. | |
| 6,214,098 B1 | 4/2001 | Lee | |
| 6,251,150 B1 | 6/2001 | Small et al. | |
| 6,270,395 B1 | 8/2001 | Towery et al. | |
| 6,293,848 B1 | 9/2001 | Fang et al. | |
| 6,299,795 B1 | 10/2001 | Liu et al. | |
| 6,313,039 B1 | 11/2001 | Small et al. | |
| 6,332,831 B1 | 12/2001 | Shemo et al. | |
| 6,375,545 B1 * | 4/2002 | Yano et al. | 451/36 |
| 6,383,065 B1 | 5/2002 | Grumbine et al. | |
| 6,435,947 B1 * | 8/2002 | Mueller et al. | 451/41 |
| 6,461,227 B1 * | 10/2002 | Fang | 451/41 |
| 6,468,428 B1 * | 10/2002 | Nishii et al. | 210/497.3 |
| 6,541,384 B1 | 4/2003 | Sun et al. | |
| 2001/0037821 A1 | 11/2001 | Staley et al. | |
| 2002/0017063 A1 * | 2/2002 | Beitel et al. | 51/307 |
| 2002/0077035 A1 | 6/2002 | Wang et al. | |
| 2003/0060135 A1 | 3/2003 | Moeggenborg et al. | |
| 2003/0084815 A1 | 5/2003 | Ohno et al. | |

FOREIGN PATENT DOCUMENTS

| | | |
|---|---|---|
| EP | 0 831 136 A2 | 3/1998 |
| EP | 0 844 290 A1 | 5/1998 |
| EP | 0 846 742 A2 | 6/1998 |
| EP | 0 984 048 A2 | 3/2000 |
| EP | 1 020 488 A2 | 7/2000 |

(Continued)

OTHER PUBLICATIONS

R. G. R. Bacon, "The Initiation of Polymerisation Processes By Redox Catalysts," *Quarterly Reviews*, pp. 287-310, no date.

(Continued)

*Primary Examiner*—Michael A. Marcheschi
(74) *Attorney, Agent, or Firm*—Morgan, Lewis & Bockius LLP

(57) ABSTRACT

The present invention provides a composition for chemical-mechanical polishing which comprises at least one abrasive particle having a surface at least partially coated by a catalyst. The catalyst comprises a metal other than a metal of Group 4(b), Group 5(b) or Group 6(b). The composition further comprises at least one oxidizing agent. The composition is believed to be effective by virtue of the interaction between the catalyst coated on the surface of the abrasive particles and the oxidizing agent, at the catalyst surface. The invention further provides a method that employs the composition in the polishing of a feature or layer, such as a metal film, on a substrate surface. The invention additionally provides a substrate produced this method.

92 Claims, No Drawings

FOREIGN PATENT DOCUMENTS

| | | |
|---|---|---|
| EP | 1 020 501 A2 | 7/2000 |
| EP | 1 036 836 A1 | 9/2000 |
| EP | 1 072 662 A1 | 1/2001 |
| JP | 10128667 | 5/1998 |
| WO | 96/38262 | 12/1996 |
| WO | 99/53532 | 10/1999 |
| WO | 01/30928 A1 | 5/2001 |
| WO | 01/32794 A1 | 5/2001 |
| WO | 02/33736 A1 | 4/2002 |

OTHER PUBLICATIONS

Cheves Walling, "Free Radicals in Solution," *John Wiley & Sons, Inc.*, (1957), pp. 564-579, no month.

Benjamin S. Lane and Kevin Burgess, "A Cheap, Catalytic, Scalable, and Environmentally Benign Method for Alkene Epoxidations," *American Chemical Society* vol. 123(12), (2001), pp. 2933-2934, no month.

Abstract for, "Comparison of Mineral and Soluble Iron Fenton's Catalysts For the Trichloroethylene", *Water Research* vol. 35(4), (2001), pp. 977-984, no month.

Notification of Transmittal of the International Search Report or the Declaration, mailed Jun. 4, 2003, in International Application No. PCT/US03/04144 of EKC Technology, Inc.

Written Opinion, mailed Dec. 11, 2003, in International Application No. PCT/US03/04144 of EKC Technology, Inc.

Fenton, H.J.H., "Oxidation of Tartaric Acid in Presence of Iron," 1894; 65, pp. 899-910, no month.

Symons, M.C.R., "Evidence for Formation of Free-Radical Intermediates in Some Reactions Involving Periodate," (1955), pp. 2794-2796, no month.

* cited by examiner

CATALYTIC COMPOSITION FOR CHEMICAL-MECHANICAL POLISHING, METHOD OF USING SAME, AND SUBSTRATE TREATED WITH SAME

This is a continuation of U.S. application Ser. No. 10/074,757 of Robert J. Small and Brandon S. Scott, entitled Catalytic Composition for Chemical-Mechanical Polishing Method of Using Same, and Substrate Treated with Same, filed Feb. 11, 2002, now abandoned, which is incorporated herein in its entirety by this reference.

FIELD OF THE INVENTION

The invention relates generally to a composition that is usefully employed in chemical-mechanical polishing processes, and an associated method of polishing a substrate. More particularly, the invention relates to a composition comprising an abrasive material that is coated with a catalyst, and an oxidizing agent. The composition is useful in the polishing of various layers, such as metal layers, on substrates.

BACKGROUND OF THE INVENTION

A semiconductor wafer, such as a silicon or a gallium arsenide wafer, generally has a substrate surface on which one or more integrated circuits is formed. The substrate surface is desirably as flat, or planar, as possible before the surface is processed to form the integrated circuits. A variety of semiconductor processes are used to form the integrated circuits on the flat surface, during which the wafer takes on a defined topography. If this topography is too irregular or includes surface imperfections, fabrication processes, such as photolithography, are often compromised, and the resulting semiconductor device is often inoperable or highly subject to failure. Thus, it is often necessary to polish the wafer surface to render it as planar or uniform as possible and to remove surface imperfections.

Chemical-mechanical polishing or planarization (CMP) processes are well-known. See, for example, *Chemical Mechanical Polishing in Silicon Processing*, Semiconductors and Semimetals, Vol. 62, Edited by Li, S. et al., which is expressly incorporated herein by this reference. CMP processes are commonly used to polish or "planarize" the surfaces of wafers at various stages of fabrication to improve wafer yield, performance and reliability. In CMP, typically the wafer is held in place on a carrier using negative pressure, such as vacuum, or hydrostatic or pneumatic pressure. The carrier is typically situated over a polishing pad that is situated on a platen. CMP generally involves applying a polishing composition or slurry to the polishing pad, establishing contact between the wafer surface and the polishing pad, and applying a downward pressure on the wafer carrier while providing relative motion, typically rotational or orbital motion, between the wafer surface and the polishing pad. Typically, this relative motion involves movement of both the carrier and the platen at the same or different speeds.

The polishing composition typically contains an abrasive material, such as silica and/or alumina particles, in an acidic, neutral, or basic solution. Merely by way of example, a polishing composition useful in the CMP of tungsten material on a substrate may contain abrasive alumina ($Al_2O_3$), also called aluminum oxide, an oxidizing agent such as hydrogen peroxide ($H_2O_2$), and either potassium hydroxide (KOH) or ammonium hydroxide ($NH_4OH$). A CMP process employing such a polishing composition may provide a predictable rate of polishing, while largely preserving desirable insulation features on the wafer surface.

CMP is used in a variety of semiconductor processes to polish wafers having a variety of surface features, such as oxide and/or metal layers. By way of example, often the surface of a semiconductor wafer has insulation or oxide features, the grooves or stud vias of which are filled with a metal or metal alloy. Typical filler metals or alloys include aluminum, copper, titanium, titanium nitride, tantalum, tantalum nitride, tungsten, or any combination of these metals or alloys. For such a semiconductor wafer, a typical CMP process involves polishing the metal in a controlled manner to "stop on" the oxide beneath the metal, such that the metal is substantially coplanar with the oxide and remains in the grooves or stud vias of the oxide. After CMP, the substantially coplanar surface is ready for further processing. CMP is currently the primary method used to polish or "planarize" wafers in back end of the line (BEOL) processes.

Semiconductor fabrication processes such as photolithography have evolved significantly, such that advanced devices having very fine oxide, metal, and other surface features, with sub-0.25 micron geometries (such as 0.18 micron or less), are now being made. Process tolerances are necessarily tighter for these advanced devices, calling for improvements in CMP technology to obtain desired material removal rates while minimizing wafer defects or damage. A variety of approaches have been taken in an effort to improve CMP processes.

One approach has involved increasing the downward pressure on the wafer carrier in order to increase material removal rates. This approach is generally disfavored as the requisite downward pressure is considered too high and too likely to cause wafer damage, such as scratching, delamination, or destruction of material layers on the wafer. When the wafer is fragile, as is generally the case with substrates layered with films, such as porous films, having a low dielectric constant, these damage issues are particularly acute and detrimental in terms of wafer yield and performance.

Another approach has involved increasing the amount of oxidizing agent used in the CMP slurry in an effort to increase chemical removal of targeted material. This approach is largely disfavored as the use of increased amounts of oxidizing agents detrimentally add to the handling issues and environmental issues associated with many oxidizing agents and thus increase costs. Attempts to catalyze the oxidizing agent to increase removal rates have also had limited success. Additional approaches have involved using a combination of CMP slurries, including for example, a zirconium slurry, a combination of abrasive particles in a CMP slurry, and/or using point-of-use mixing techniques. These approaches are generally undesirable, as they typically complicate CMP in terms of tooling and process control for example, consume more process time, and/or increase costs.

Further developments in the field of CMP technology are desired.

SUMMARY OF THE INVENTION

The present invention provides a composition for chemical-mechanical polishing which comprises at least one abrasive particle having a surface at least partially coated by a catalyst. The catalyst comprises a metal other than a metal of Group 4(b), Group 5(b) or Group 6(b) of the Periodic Table of Elements. Generally, metals of Group 1(b) or Group 8 are suitable candidates, as are metals having a standard oxidation potential of from about −0.52 to about −0.25 eV. It is believed that the catalyst-coated abrasive favorably interacts with any one of a number of oxidizing agents typically employed in chemical-mechanical polishing compositions. Thus, the composition also comprises such an oxidizing agent. The oxidizing agent is preferably in the form of an organic or inorganic per compound, although other oxidizing agents, such as hydroxylamine for example, may be used.

The composition may contain a variety of other additives, such as a typical abrasive (i.e., an abrasive lacking a catalyst coating), a surfactant, a stabilizing agent, a dispersion agent, a polish-enhancement agent, and/or a pH-adjusting agent. The pH level of the composition should be in a range of from about pH 2 to about pH 11, with a preferred upper level of about pH 8.

The composition of the present invention is effective in the CMP of a variety of metal or metal alloy materials on substrates such as silicon or semiconductor substrates. It is theorized that the catalyst-coated abrasive and the oxidizing agent react at the catalyst surface to generate free radicals that are effective intermediates in the reaction between the oxidizing agent and the material targeted for removal from the substrate surface. Further, it is believed that the catalyst-coated abrasive is particularly effective as it brings the catalyst directly to the targeted material on the substrate surface, and thus facilitates or accelerates the removal reaction substantially at the site of the targeted material.

The composition provides very desirable material removal rates, for example, up to 15,000 Angstroms (Å) per minute, in a CMP process. This removal rate is so good that it may be desirable to adjust the composition or the CMP process to bring the rate down to a level suitable for certain applications, such as the CMP of very thin films, for example, a copper film of about 3000 Å in thickness. The composition is effective when used in conventional CMP processes, as well as CMP processes having relatively low carrier pressures.

Substrates polished using the composition show good uniformity values, as reflected by relatively low within-wafer nonuniformity percentages. For example, in one example provided herein, the within-wafer nonuniformity of the polished substrate was about 4.57 percent.

Additional features, aspects and advantages of the present invention will become apparent from the description of preferred embodiments and the various examples set forth below.

DESCRIPTION OF PREFERRED EMBODIMENTS

The composition of the present invention is usefully employed in the chemical-mechanical polishing (CMP) of a substrate. The composition or slurry may be used to polish at least one feature or layer on a substrate such as a silicon substrate, a gallium arsenide (GaAs) substrate, a thin film transistor-liquid crystal display ("TFT-LCD") glass substrate, or any other substrate associated with integrated circuits, thin films, semiconductors, Micro Electro Mechanical Systems (MEMS) structures, hard disk platters and heads, and the like. By way of example, the composition of the present invention may be used in the CMP of a substrate having one or more layers of aluminum, copper, copper-aluminum alloy, tantalum, titanium, tungsten, or tantalum-, titanium-, or tungsten-containing alloys, such as tantalum nitride, titanium nitride, titanium tungsten, or any combination thereof.

Generally, throughout this description, any mention of a component of the composition refers to at least one such component, for example, one such component or multiple such components. Further, any amount of a component of the composition is given as a weight percent (wt. %) relative to the composition. Additionally, any amount of a component is given as an approximate amount, for example, more or less than, or equal to, the precise numerical amount stated. This convention concerning approximate amounts applies to any numerical measure stated herein in connection with the composition, such as a numerical pH level stated for the composition or a numerical process parameter stated for a CMP process employing the composition. The foregoing conventions apply throughout this specification unless specified or clearly intended or implied otherwise.

The composition generally comprises at least one oxidizing agent and at least one abrasive that is at least partially coated by a catalyst, as further described herein. Typically, the abrasive component comprises a portion of abrasive that is coated with catalyst (sometimes referred to herein as "coated abrasive") and a portion of abrasive that is not coated with catalyst (sometimes referred to herein as "normal abrasive"), although only the former need be present. For example, the abrasive may comprise a ratio of coated abrasive to normal abrasive of about 1 to about 9. Each of the components of the composition and typical, preferred, and more preferred amounts thereof, in approximate weight percent (wt. %) relative to the composition, are provided below in Table 1.

TABLE 1

Chemical-Mechanical Polishing Composition

| Component | Typical Amount | Preferred Amount | More Preferred Amount |
|---|---|---|---|
| Oxidizing Agent | 0.01 to 30 wt. % | 0.01 to 10 wt. % | 0.01 to 6 wt. % |
| Normal Abrasive | 0.01 to 30 wt. % | 0.01 to 20 wt. % | 0.01 to 10 wt. % |
| Coated Abrasive | 0.01 to 50 wt. % | 0.01 to 20 wt. % | 0.01 to 10 wt. % |

The oxidizing agent of the CMP composition assists in the chemical removal of targeted material on the substrate surface. The oxidizing agent component is thus believed to enhance or increase the material removal rate of the composition. Preferably, the amount of oxidizing agent in the composition is sufficient to assist the chemical removal process, while being as low as possible to minimize handling, environmental, or similar or related issues, such as cost. The various amounts of oxidizing agent provided in Table 1 are all effective and suitable, while the more preferred amount of from about 0.01 to about 6 weight percent relative to the composition, is particularly preferred in terms of minimizing the potential issues mentioned above.

The oxidizing agent is preferably an inorganic or organic per-compound. A per-compound is generally defined as a compound containing an element in its highest state of oxidation, such as perchloric acid; a compound containing at least one peroxy group (——O——O——), such as per-acetic acid and perchromic acid; or a compound having exhaustive substitution or addition, such as perchloroethylene. *The Condensed Chemical Dictionary*, Tenth Edition, Revised by Hawley, G. Suitable per-compounds containing at least one peroxy group include, but are not limited to, hydrogen peroxide, urea hydrogen peroxide, a monopersulfate ($SO_5^{dbd}$), a dipersulfate ($S_2O_8^{dbd}$), peracetic acid, a percarbonate, an organic peroxide, such as benzoyl peroxide, di-t-butyl peroxide, any acid thereof, any salt thereof, any adduct thereof, and any combination of the foregoing. Suitable per-compounds that do not contain a peroxy group include, but are not limited to, periodic acid, any periodiate salt, perbromic acid, any perbromate salt, perchloric acid, any perchlorate salt, perboric acid, any perborate salt, permanganate, any permanganate salt, and any combination of the foregoing. Most preferably, the oxidizing agent is a per-compound or a compound possessing a reactive peroxy functional group, such as monopersulfate, di-persulfate, peracetic acid, urea hydrogen peroxide, hydrogen peroxide, any acid, salt, or adduct thereof, and any combination of the foregoing.

Other oxidizing agents are also suitable components of the composition of the present invention. For example, ozone is a suitable oxidizing agent either alone or in combination with one or more other suitable oxidizing agents. Further by way of example, the oxidizing agent may be a metal salt, a metal complex or coordination compound, or any combination thereof An organic or inorganic hydroxylamine compound or salt is yet another possible oxidizing agent component for the composition.

A sampling of suitable oxidizing agents includes iron salts, aluminum salts, sodium salts, potassium salts, as well as ammonium salts, quaternary ammonium salts, phosphonium salts, peroxides, chlorates, perchlorates, permanganates, persulfates, and any combination thereof. In general, the various oxidizing agents described herein may be used either alone or in combination with one another, although any combination that might undesirably complicate the CMP process is preferably avoided.

In addition to the oxidizing agent component, the composition also comprises an abrasive that is at least partially coated by a catalyst. The abrasive is effective in the mechanical removal of targeted material on the substrate surface. Suitable amounts of catalyst-coated abrasive, such as the preferred range of from about 0.01 to about 20 weight percent relative to the composition, are listed in Table 1 above. Suitable amounts of normal abrasive, if any, are also listed in Table 1.

The abrasive is generally in the form of an abrasive particle, and typically many abrasive particles, of one material or a combination of different materials. Generally, a suitable abrasive particle is more or less spherical and has an effective diameter of about 30 to about 170 nanometers (nm), although individual particle size may vary. Abrasive in the form of aggregated or agglomerated particles are preferably processed further to form individual abrasive particles.

The abrasive particle may be a metal oxide particle, a resinous particle, or a plastic particle, and is preferably a metal oxide particle. A suitable metal oxide abrasive includes, but is not limited to, alumina, ceria, germania, silica, spinel, titania, an oxide of tungsten, zirconia, and any combination thereof. The metal oxide abrasive may be produced by any of a variety of techniques, including sol-gel, hydrothermal, hydrolytic, plasma, fuming and precipitation techniques, and any combination thereof. Preferably, the metal oxide abrasive is a precipitated or fumed abrasive, and preferably a fumed abrasive. By way of example, the metal oxide abrasive may be a fumed abrasive such as fumed silica or fumed alumina. In general, the above-mentioned metal oxide abrasives may be used either alone or in combination with one another, although any combination that might undesirably complicate the CMP process is preferably avoided.

As mentioned above, other abrasives, such as plastic or resinous abrasives, are suitable components of the composition of the present invention. For example, a suitable plastic abrasive particle may be composed of a polyacrylic acid, a polymethylacrylic acid, a polyvinyl alcohol, or any combination thereof. Further by way of example, a suitable resinous abrasive particle may be composed of a polyacrylic acid, a polymethylacrylic acid, a polymelamine, or any combination thereof, or any particle of a ion exchange resin, such as a plastic ion exchange resin.

According to the present invention, the abrasive is at least partially coated by a catalyst. The catalyst enhances, or increases, the rate of the chemical reaction between the oxidizing agent of the composition and the targeted material, particularly metal material, on the substrate surface during a CMP process. The catalyst is believed to assist in the formation of activated oxidizing species, such as activated peroxy groups, at reaction sites on the material targeted for removal. Preferably, the catalyst is substantially insoluble in the composition such that it remains for the most part on the abrasive particle during the CMP process.

Care should be taken as to the amount of catalyst-coated abrasive used, as using too much catalyst may compromise control of the CMP process. The amount of catalyst-coated abrasive should generally not exceed 50 weight percent of the composition. Where catalyst concentration is a concern, an increased amount of normal abrasive, absent a catalyst coating, may be used to dilute the catalyst in the composition and facilitate control of the CMP process.

As mentioned above, the abrasive material of the composition is at least partially coated with the catalyst. As used herein, "coating" and its various linguistic or grammatical forms or counterparts generally refer to forming a physical connection between the abrasive and the catalyst, such as by forming at least a partial layer of catalyst material on at least a portion of the abrasive, absorbing or adsorbing the catalyst material on at least a portion of the abrasive, forming adhesion between the catalyst material and at least a portion of the abrasive, and the like, by any suitable means or method. By way of example, a method of producing a silica sol coated with iron acetate is provided in U.S. Pat. No. 4,478,742 of Payne, the entire contents of which are incorporated herein by this reference. The catalyst may coat from about 5 to about 100 percent of the surface of the abrasive particle, such as from about 5 to about 80 percent of the particle surface, or preferably, from about 25 to about 50 percent of the particle surface.

The catalyst comprises a metal other than a metal from Groups 4(b), 5(b) and 6(b) of the Periodic Table of the Elements. See, for example, *Handbook of Chemistry and Physics*, $64^{th}$ Edition, Periodic Table of the Elements, Inside Front Cover, which is fully incorporated herein by this reference. A suitable metal includes, but is not limited to, cobalt, copper, iron, nickel, silver, and any combination thereof. Further examples of suitable metals include those from Group 1(b) and Group 8 of the Periodic Table of the Elements. Preferably, the catalyst, or the metal thereof, is substantially insoluble in the composition.

Catalysts having a standard oxidization potential of from about −0.52 to about −0.25 eV are also contemplated as having suitable catalytic activity for compositions of the present invention. Examples of metal catalysts with oxidation potentials in this range include copper (−0.52 eV), iron (−0.44 eV), cobalt (−0.28 eV), and nickel (−0.25 eV). Further, it is believed that catalysts having a standard oxidation potential of from about −0.5 to about −0.4 eV have an optimal or preferred catalytic activity. An example of a metal catalyst with an oxidation potential in this range is iron, a preferred catalyst or catalyst component herein. As mentioned previously, there are a variety of suitable metal catalysts, such as any comprising a metal from Group 1(b) and Group 8 of the Periodic Table of the Elements.

The catalyst may be in a variety of forms, such as an oxide, a nitrate, a halide, such as chloride, a perchlorate, or an acetate of the metal, a source of ions of the metal, and any combination thereof. By way of example, suitable metal oxides include iron oxide, copper oxide, and cobalt oxide. Further by way of example, the catalyst may be a source of multivalent metal, such as a source of divalent iron. Preferably, the catalyst is a metal acetate, such as copper acetate ("CuAc") or iron acetate ("FeAc").

It is believed that the composition of the present invention is particularly advantageous by virtue of the interaction between the catalyst surface and the oxidizing agent. That is, it is believed that a reaction takes place between the catalyst that is coated on the abrasive, and the oxidizing agent, such as a peroxide or hydroperoxide, at the catalyst surface. It is believed that this reaction generates free radicals or active reaction intermediates, such as hydroxyl free radicals (HO.), at the catalyst surface, which favorably interact with the targeted material on the substrate when the catalyst coating on the abrasive contacts the substrate surface. Descriptions of redox systems involving catalysts that generate free radicals in the presence of oxidizing agents are provided in Walling, C., *Free Radicals in Solution* (1957), pp. 564–579, and Bacon, R., *The Initiation of Polymerisation Processes by Redox Catalysts,* Quart. Revs., Vol. IX (1955), pp.287–310, the entire contents of which are fully incorporated herein by this reference. Such catalysts are candidate coatings for the abrasive used in the composition.

The pH of the composition is desirably on the order of from about pH 2 to about pH 11, and preferably, from about pH 2 to about pH 8. These pH levels, and particularly the preferred levels, are believed to facilitate control of the CMP process. A composition having a pH that is too low, such as below pH 2, may present problems in terms of the handling of the composition and the quality of the polishing itself. A composition having a pH that is too high, such as above pH 11, may detrimentally contribute to corrosion or other attack on the metal layer, such as copper or tungsten, on the substrate surface, depending on the nature of the metal layer. This may not be an issue in the polishing of metal layers such as aluminum or exotic metals, which may tolerate a CMP composition of relatively high pH without ill effect.

The pH of the composition may be adjusted using an appropriate pH-adjusting agent, such as a suitable acid, base, amine, or any combination thereof. The pH-adjusting agent may contain metal ions. Examples include metal hydroxides, such as NaOH, KOH and the like, containing sodium, potassium, and like metal ions, respectively. Preferably, the pH-adjusting agent used in the composition does not contain any undesirable metal ions, such that undesirable metal components are not introduced into the composition. Suitable pH-adjusting agents include amines, ammonium hydroxide, nitric acid, phosphoric acid, sulfuric acid, organic acids, and any combination thereof.

The composition may also include one or more of various optional additives. Suitable optional additives include surfactants, stabilization agents, dispersion agents, and the like. These optional additives are generally employed to facilitate or promote stabilization of the composition against settling, flocculation (including precipitation, aggregation or agglomeration of particles, and the like), decomposition, and the like. Examples of these optional additives include sulfuric acid, phosphoric acid, nitric acid, ammonium salts, potassium salts, sodium salts, or other cationic salts of sulfates and phosphates, and any combination thereof.

In general, any of these optional additives should be present in an amount sufficient to substantially stabilize the composition. The necessary amount varies depending on the particular additive selected and the particular make-up of the CMP composition, such as the nature of the surface of the abrasive component. If too little of the additive is used, the additive will have little or no effect on the stability of the composition. On the other hand, if too much of the additive is used, the additive may contribute to the formation of undesirable foam and/or flocculant in the composition. Generally, suitable amounts of these optional additives range from about 0.001 to about 2 weight percent relative to the composition, and preferably from about 0.001 to about 1 weight percent. These optional additives may be added directly to the composition or applied to the surface of the abrasive component of the composition.

While there are many suitable surfactant additives for the composition, preferred surfactant additives include dodecyl sulfate sodium salt, sodium lauryl sulfate, dodecyl sulfate ammonium salt, and any combination thereof. Suitable commercially available surfactants include TRITON DF-16 manufactured by Union Carbide and SURFYNOL manufactured by Air Products and Chemicals.

Stabilization agents may be used to stabilize the catalyst in the presence of the oxidizing agent of the composition. For example, stabilizers may be needed to stabilize a metal ion catalyst in the presence of an oxidizing agent, such as hydrogen peroxide. If a stabilization agent is not used, the oxidizing agent and the catalyst may react in a manner that rapidly degrades the oxidizing agent and thus compromises the CMP process. On the other hand, the presence of a stabilization agent in the composition may compromise the efficacy of the catalyst. Thus, for optimal CMP performance, careful consideration should be given as to whether or not to use a stabilizing agent in the composition, and as to the selection and amount of any stabilization agent added to the composition.

Suitable stabilizing agents include organic acids, such as adipic acid, carboxylic acid, citric acid, malonic acid, orthophthalic acid, and ethylenediaminetetraacetic acid, phosphoric acid, phosphonate compounds, nitrites, and other ligands, such as those that bind the catalyst material and thus reduce reactions that degrade the oxidizing agent, and any combination of the foregoing agents. As used herein, an acid stabilizing agent refers to both the acid stabilizer and its conjugate base. That is, the various acid stabilizing agents may also be used in their conjugate form. By way of example, herein, an adipic acid stabilizing agent encompasses adipic acid and/or its conjugate base, a carboxylic acid stabilizing agent encompasses carboxylic acid and/or its conjugate base, carboxylate, and so on for the above-mentioned acid stabilizing agents. A suitable stabilizer, used alone or in combination with one or more other stabilizers, decreases the rate at which an oxidizing agent such as hydrogen peroxide decomposes during a CMP process.

Optionally, certain additives or polish-enhancement agents may be added to the composition to enhance or improve the polishing rate of targeted material on the substrate surface, such as tantalum and titanium material often present in the form of barrier layers on the substrate surface. An example of a polish-enhancement agent is hydroxylamine, which is particularly effective when the targeted material is tantalum. Polishing-enhancement agents other than hydroxylamine, such as fluoride-based agents, are generally preferred for use with peroxide-containing compositions. The optional polishing-enhancement agent, if any, is generally present in an amount of from about 0.001 to about 2 weight percent, or preferably, from about 0.001 to about 1 weight percent, relative to the composition.

The CMP composition or slurry of the present invention may be prepared using conventional techniques. Typically, the water and abrasive components are combined, catalyst-coated abrasive is then added, oxidizer is then added, and the pH is adjusted. Alternatively, according to one aspect of the present invention, the catalyst-coated abrasive may be added to an existing CMP composition, such as a commercially available CMP composition that contains an oxidizing agent. For example, the catalyst-coated abrasive may be added to a previously formulated peroxide composition to provide a CMP composition of this invention.

In some CMP processes, particularly some of the advanced polishing processes, the composition is prepared by adjusting the amount of each composition component in real time, just prior to a re-mixing of the composition at the point of use. For most CMP processes, the prepared composition is re-mixed at the point of use, whereupon it is poured onto the polishing pad. Typically, the composition is poured onto the pad as it is moved or rotated. As the CMP process proceeds, additional slurry may be added or excess slurry may be removed, as desired or necessary.

Examples of the composition according to the present invention are provided below. A first example concerns two CMP compositions, Composition A and Composition B, which are particularly suited to CMP of a wafer, such as a silicon wafer, having a tungsten layer or feature on its surface. The components of the two compositions and the approximate amounts thereof, as well as the approximate pH of the compositions, are set forth in Table 2.

TABLE 2

Chemical-Mechanical Polishing Compositions A and B

| Composition | Hydrogen Peroxide | Peracetic Acid | Mirasol 3070 | Mirasol 3070 with Catalyst | pH |
|---|---|---|---|---|---|
| Composition A | 3 wt. % | 0 wt. % | 5 wt. % | 0.5 wt. % | 2 |
| Composition B | 0 wt. % | 5 wt. % | 5 wt. % | 0.5 wt. % | 2 |

In Composition A, hydrogen peroxide ($H_2O_2$) served as an oxidizing agent, Mirasol 3070, a commercially available aqueous solution of abrasive silica particles, served as an abrasive, Mirasol 3070 with a cationic iron catalyst absorbed onto at least a portion of the surface of the silica particles, served as an abrasive coated with a catalyst, and deionized water made up the remainder of the composition. Composition B differed from Composition A in that peracetic acid ($CH_3COOOH$), rather than hydrogen peroxide, served as an oxidizing agent. For both Composition A and Composition B, the Mirasol 3070 component, as opposed to the oxidizing agent or the catalyst, was believed to be predominantly responsible for determining the pH of the composition.

Mirasol 3070, commercially available from Precision Colloids, LLC of Cartersville, Ga., contains approximately 30 weight percent silica ($SiO_2$) particles, which generally have an effective diameter of approximately 70 nanometers. Mirasol 3070 coated with catalyst contains the above-described Mirasol 3070 with iron acetate catalyst coated on about 70 percent of the surface area of each silica particle.

Each of the Compositions A and B were used in a conventional CMP process performed on a silicon substrate at least partially layered with a tungsten film of about 8000 Angstroms (Å) in thickness. The process parameters included a carrier pressure of about 6 pounds per square inch (psi), a carrier speed of about 90 revolutions per minute (rpm), a platen speed of about 90 rpm, and a flow rate for the CMP composition used of about 175 milliliters per minute (ml/min), as set forth in Table 3 below. The processes differed only in terms of which CMP composition was used. The results of each CMP process in terms of the approximate material (tungsten) removal rate in Angstroms per minute (Å/min) and the approximate within-wafer nonuniformity percentage (% WIWNU) are set forth in Table 4.

TABLE 3

Chemical-Mechanical Polishing Process Using Composition A or Composition B

| Composition | Carrier Pressure (psi) | Carrier Speed (rpm) | Platen Speed (rpm) | Composition Flow Rate (ml/min) |
|---|---|---|---|---|
| Composition A | 6 | 90 | 90 | 175 |
| Composition B | 6 | 90 | 90 | 175 |

TABLE 4

Chemical-Mechanical Polishing Results Using Composition A or Composition B

| Composition | Removal Rate (Å/min) | Nonuniformity (% WIWNU) |
|---|---|---|
| Composition A | 5040 | 10.9 |
| Composition B | 5077 | 7.42 |

As mentioned previously, in CMP processes, and particularly modern or advanced CMP processes, it is desirable to obtain acceptable or optimal, such as increased, material removal rates while using acceptable or optimal, such as not unduly high, carrier pressures. In the CMP of tungsten-layered wafers, a good carrier pressure is about 9 psi or less, such as about 6 psi, and a good outcome at a pressure of about 6 psi is a removal rate of greater than about 5000 Å/min. Further, obtaining polished wafers with uniformity values of from about 3 to about 12% WIWNU percent is considered a good result. While the foregoing examples of process parameters, outcomes and results are often desirable, other suitable outcomes and results are contemplated herein.

In the CMP processes performed with Composition A and Composition B, desirable tungsten removal rates of about 5040 and 5077 Å/min, respectively, were obtained. Additionally, the surfaces of the polished wafers were substantially uniform, having 10.9 and 7.42% WIWNU, respectively. Composition B is generally preferred over Composition A, given its higher removal rate and better uniformity value (lower % WIWNU). It should be noted that while there is a general preference for compositions that provide high removal rates, other factors, such as good uniformity values (for example, low % WIWNU), efficient use of oxidizer, and good storage and handling characteristics, are also important considerations in the evaluation of a composition of the present invention.

A second example of the composition of the present invention concerns two CMP compositions, Composition C and Composition D, which were used in the CMP of a silicon wafer that had a copper layer or feature on its surface. In this example, the copper layer had a thickness of about 15,000 Å. The components of the two compositions and the approximate amounts thereof, as well as the approximate pH of the compositions, are set forth in Table 5.

TABLE 5

Chemical-Mechanical Polishing Compositions C and D

| Composition | Hydroxyl-amine | Peracetic Acid | Mirasol 3070 | Mirasol 3070 and Catalyst | pH |
|---|---|---|---|---|---|
| Composition C | 0 wt. % | 1.5 wt. % | 5 wt. % | 0.5 wt. % | 2 |
| Composition D | 4 wt. % | 0 wt. % | 5 wt. % | 0.5 wt. % | 6.7 |

In Composition C, peracetic acid ($CH_3COOOH$) served as an oxidizing agent, Mirasol 3070 (described above) served as an abrasive, Mirasol 3070 coated with catalyst (described above) served as an abrasive coated with a catalyst, and deionized water made up the remainder of the composition. Composition D differed from Composition C in that hydroxylamine ($NH_2OH$), rather than peracetic acid, served as an oxidizing agent. The two compositions also differed in terms of pH, Composition C having a pH of about 2 and Composition D having a pH of about 6.7.

Each of the Compositions C and D were used in a conventional CMP process performed on a silicon wafer at least partially layered with copper. When Composition C was used, the process parameters included a carrier pressure of about 4 psi, a carrier speed of about 40 rpm, a platen speed of about 40 rpm, and a flow rate for the Composition C of about 100 ml/min. When Composition D was used, the process parameters included a carrier pressure of about 4 psi, a carrier speed of about 75 rpm, a platen speed of about 75 rpm, and a flow rate for the Composition D of about 175 ml/min. The parameters of each CMP process are set forth in Table 6 and the results thereof in terms of the approximate material (copper) removal rate and the approximate within-wafer nonuniformity percentage are set forth in Table 7.

TABLE 6

Chemical-Mechanical Polishing Process Using Composition C or Composition D

| Composition | Carrier Pressure (psi) | Carrier Speed (rpm) | Platen Speed (rpm) | Composition Flow Rate (ml/min) |
|---|---|---|---|---|
| Composition C | 4 | 40 | 40 | 100 |
| Composition D | 4 | 75 | 75 | 175 |

TABLE 7

Chemical-Mechanical Polishing Results Using Composition C or Composition D

| Composition | Removal Rate (Å/min) | Nonuniformity (% WIWNU) |
|---|---|---|
| Composition C | 15,000 | Not measurable |
| Composition D | 7797 | 8.87 |

As mentioned previously, in CMP processes, and particularly modern or advanced CMP processes, it is desirable to obtain acceptable or optimal, such as increased, material removal rates while using acceptable or optimal, such as not unduly high, carrier pressures. In the CMP of copper-layered wafers, a good carrier pressure is about 9 psi or less, such as about 4 psi, and a good outcome at a pressure of about 4 psi is a removal rate of greater than about 7500 Å/min. While the foregoing examples of process parameters, outcomes and results are often desirable, other suitable outcomes and results are contemplated herein.

In the CMP process performed with Composition C, an unusually high copper removal rate was obtained, such that all of the copper was removed. This result prevented measurement of a uniformity value. In the CMP process performed with Composition D, a desirable copper removal rate was obtained. Additionally, the surface of the wafer polished using Composition D was substantially uniform. Composition D is thus a desirable composition of the present invention. Composition C is also a useful composition of the present invention, although it may be a bit too aggressive in terms of removal rate for some applications, such as in the polishing of very thin layers on a substrate. Accordingly, for some applications, a CMP process using Composition C may be altered by diluting the composition, diluting the catalyst-coated abrasive and/or oxidizing agent components of the composition, changing the composition flow rate, or the like.

A third example concerns two CMP compositions of the present invention, Composition B, from the first example above, and Composition E, each of which were used in the CMP of a silicon wafer that had a tungsten layer on its surface, the layer being of about 8000 Å in thickness. Composition B was compared to a similar composition, Composition 1, and Composition E was compared to a similar composition, Composition 2. Neither of Compositions 1 and 2 contained catalyst-coated abrasive. The pH of all four compositions was about 2. The components of the four compositions and the approximate amounts thereof are set forth in Table 8 below. Composition E and Composition 2 contained ethylene glycol, the purpose of which was to boost the removal rate. It is believed that this ethylene glycol additive acts as a catalyst promoter or an inhibitor as to the polishing of the oxide.

TABLE 8

Chemical-Mechanical Polishing Compositions B and E and Compositions 1 and 2

| Composition | Hydrogen Peroxide | Peracetic Acid | Mirasol 3070 | Mirasol 3070 with Catalyst | Ethylene Glycol |
|---|---|---|---|---|---|
| Composition B | 0 wt. % | 5 wt. % | 5 wt. % | 0.5 wt. % | 0 wt. % |
| Composition 1 | 0 wt. % | 5 wt. % | 5 wt. % | 0 wt. % | 0 wt. % |
| Composition E | 3 wt. % | 0 wt. % | 5 wt. % | 0.5 wt. % | 0.25 wt. % |
| Composition 2 | 3 wt. % | 0 wt. % | 5 wt. % | 0 wt. % | 0.25 wt. % |

Each of the four compositions were used in a conventional CMP process having the same process parameters as previously described in the first example and set forth in Table 3 above. Each of Compositions 1 and 2 were tested twice, in a Trail A and a Trial B, respectively. The results of each CMP process in terms of the approximate material (tungsten) removal rate in Å/min and the approximate % WIWNU are set forth in Table 9.

TABLE 9

Chemical-Mechanical Polishing Results Using Composition B or E or Composition 1 or 2

| Composition | Removal Rate (Å/min) | Nonuniformity (% WIWNU) |
|---|---|---|
| Composition B | 5077 | 7.42 |
| Composition 1: | | |
| Trial A | 2215 | 6.96 |
| Trial B | 2466 | 6.94 |
| Composition E | 4476 | 4.57 |
| Composition 2: | | |
| Trial A | 1556 | 3.42 |
| Trial B | 1582 | 3.34 |

In terms of the tungsten removal rate, Composition B outperformed Composition 1 by over 200 percent (up to about 229%) and Composition E outperformed Composition 2 by over 280 percent (up to about 288%). The CMP performances of Composition B and Composition E are impressive, even when the moderate decreases in surface uniformity are considered. These results demonstrate that the catalyst-coated abrasive is an effective, if not potent, component in the compositions of this invention.

This effective catalyst-coated abrasive component functions optimally when it is relatively, if not substantially, stable. Catalyst stability is a desirable characteristic in the composition, as it facilitates control of the CMP process. Thus, tests were conducted to determine the relative stability of the catalyst-coated abrasive used in the composition of the present invention, as compared with that of a soluble catalyst, in the presence of an oxidizing agent, in two other compositions. In these tests, the "coated catalyst" composition was composed of the catalyst-coated abrasive in the form of iron-coated (FeAc-coated) silica particles, and an oxidizing agent in the form of hydroxylamine, and had a pH of about 7. The first "free catalyst" composition was composed of normal abrasive in the form of silica particles, soluble catalyst in the form of iron nitrate, and oxidizing agent in the form of hydroxylamine, and had a pH of about 7. The second "free catalyst" composition was composed of all of the components of the first "free catalyst" composition except for the abrasive component.

The three test compositions were prepared as set forth below. A "coated catalyst" preparation was obtained by adding an appropriate amount of the catalyst-coated abrasive to 50 milliliters of water, while a first "free catalyst" preparation was obtained by adding the silica particles to 50 ml of water, and then adding an appropriate amount of the iron nitrate to the water-abrasive mixture. The amount of abrasive in the first "free catalyst" preparation was similar to the amount of catalyst-coated abrasive used in the "coated catalyst" preparation. A second "free catalyst" preparation containing only iron nitrate dissolved in 50 ml of water (i.e., no abrasive) was also prepared.

The same designated amount of 50% hydroxylamine was added to each of these preparations to obtain the three test compositions. At a pH of over 6, hydroxylamine is a good reducing agent, the stability of which is extremely sensitive to trace metals in solution. Hydroxylamine reacts easily with many transition metal ions, such as cobalt, copper and iron ions, resulting in the reduction of the metal ions by at least one oxidation level and the formation of by-products including nitrogen gas, ammonia ($NH_3$), water, and possibly heat, depending on the concentration of the hydroxylamine. A high level of reactivity, or a very fast reaction rate, is a sign of relative instability.

When the hydroxylamine component was added to obtain the "coated catalyst" composition, little color change, little or no outgassing, and little or no precipitation were observed. When the first "free catalyst" composition containing silica abrasive was formed, an immediate color change (light orange to brown), substantial outgassing, and precipitation were observed. When the second "free catalyst" composition containing no abrasive was formed, a more immediate color change (light orange to very dark brown) and similar outgassing, as compared to the first "free catalyst" composition, were observed. The "coated catalyst" composition was clearly more stable than the two relatively unstable "free catalyst" compositions tested. The compositions of the present invention are all of the "coated catalyst" variety, comprising a catalyst-coated abrasive rather than solely a free, soluble catalyst such as iron nitrate. As demonstrated above, this relatively stable, catalyst-coated abrasive is an extremely effective component of the composition of this invention.

The composition of the present invention is advantageously used in conventional CMP processes, and more particularly, in CMP processes that call for reduced carrier pressures. Generally, carrier pressures of from about 0.5 to about 2 psi are considered low carrier pressures, although this pressure range depends on the particular CMP process under consideration. Low carrier pressures are often desirable because they reduce the risk of wafer damage, such as scratching, delaminating, or destroying of material layers, particularly metal layers, on the wafer surface. When the composition of the present invention is used in a low-carrier-pressure process, desirable material removal rates are obtainable even though the carrier pressure is low. Appropriate use of the composition in CMP processes may reduce the risk of wafer damage and improve wafer yield and performance.

Additionally, the composition of the present invention may be advantageously used in the CMP of wafers layered with relatively fragile films, such as porous films, that have low dielectric constants. At the pressures used in typical CMP processes, these films are particularly vulnerable to delamination, crushing, or other damage. In advanced CMP processes used for these wafers, carrier pressures of about 2 psi are desirable and carrier and platen speeds are about the same as, or often greater than, those used in typical CMP processes. For a wafer layered with a porous material of relatively low dielectric constant, such as from about 1.5 or about 1.7 to about 2.3, and of about 0.1 micron in thickness, a removal rate of greater than about 5000 Å/min is desirable. As demonstrated herein, these removable rates are obtainable when the composition of the present invention is used in CMP, even when the carrier pressure is relatively low. The compositions of the present invention are believed suitable for use in CMP processes having even lower carrier pressures, such as the low carrier pressures described above.

As demonstrated herein, the composition of the present invention may be used in CMP processes to obtain desirable material removal rates and within-wafer nonuniformity values. Merely by way of example, the composition may be used in the CMP of a substrate surface having a feature, layer or film thereon, such as a film of aluminum, copper, titanium, tungsten, an alloy thereof, or any combination thereof. Further by way of example, the composition may be used in the CMP of such a substrate surface, where the film has an adjacent or an underlying feature, layer or film, such as a film of tantalum, tantalum nitride, titanium, titanium nitride, titanium tungsten, tungsten, and any combination thereof.

Accordingly, the present invention includes a method of polishing a substrate surface having at least one feature thereon that comprises a metal, such as metal or metal alloy feature. The substrate undergoing polishing may be any suitable substrate, such as any of the substrates described herein. According to the method of the invention, a composition of the invention is provided and the feature on the substrate surface is polished. The polishing is chemical-mechanical polishing, such as that associated with any conventional or known CMP process, any suitable later-developed CMP process, or any CMP process described herein. The polishing process parameters may be any suitable parameters, such as any of the parameters described herein. For example, the carrier pressure applied to the substrate surface, or the feature thereon, may be from about 1 to about 6 psi.

Generally, the polishing of the substrate surface continues until the targeted feature or layer is substantially coplanar with surrounding material, such as an oxide material, on the substrate. For example, the polishing of a metal-featured substrate may continue until any metal excess is sufficiently removed to provide a substantially uniform profile across the substrate surface. By way of example, suitable surface uniformity (typically measured using known wafer profiling techniques) is reflected by within-wafer nonuniformity (WIWNU) values of less than about 12%, and preferably, from about 4% to about 6%, the lower values typically reflecting better process control. Appropriate WIWNU values may vary depending on the characteristics of the CMP process and the substrates undergoing polishing.

The inventive method may be used to remove targeted material, such as metal or metal alloy, from the substrate surface at a rate of from about 100 to about 10,000 or to about 15,000 Å/min. The present method may be used to provide a polished substrate surface of good uniformity, such as a substrate surface having from about zero to about 40 percent, preferably, from about zero to about 12 percent, or more preferably, from about zero to about 10 percent, within-wafer nonuniformity. Further, the present method may be used to provide a polished substrate surface wherein any microscratch on the surface that is associated with the polishing is less than about 20 Å. The present invention further encompasses a substrate produced by the inventive method, including any of the substrates described herein, and any of the substrates having any of the qualities, such as desirable uniformity values and surface characteristics, described herein.

Various aspects and features of the present invention have been explained or described in relation to beliefs or theories, although it will be understood that the invention is not bound to any particular belief or theory. Further, although the various aspects and features of the present invention have been described with respect to preferred embodiments and specific examples herein, it will be understood that the invention is entitled to protection within the full scope of the appended claims.

The invention claimed is:

1. A composition for chemical-mechanical polishing, comprising:
   at least one oxidizing agent;
   at least one abrasive particle; and
   a catalyst, wherein the catalyst is a source of an ion of a metal, wherein the metal ion is selected from the group consisting of cobalt, copper, iron, nickel, silver and any combination thereof, and further wherein there is a physical connection between the metal ion and at least a portion of the surface of the abrasive particle.

2. The composition of claim 1, wherein the oxidizing agent comprises a per compound.

3. The composition of claim 1, wherein the oxidizing agent comprises ozone.

4. The composition of claim 3, wherein the composition further comprises an oxidizing agent selected from a group consisting of a metal salt, a metal complex, and any combination thereof.

5. The composition of claim 1, wherein the oxidizing agent is selected from a group consisting of hydroxylamine, a salt of hydroxylamine, and any combination thereof.

6. The composition of claim 1, wherein the oxidizing agent is in an amount of from about 0.01 to about 30 weight percent relative to the composition.

7. The composition of claim 1, wherein the oxidizing agent is in an amount of from about 0.01 to about 10 weight percent relative to the composition.

8. The composition of claim 1, wherein the oxidizing agent is in an amount of from about 0.01 to about 6 weight percent relative to the composition.

9. The composition of claim 1, wherein the at least one abrasive particle comprises a metal oxide.

10. The composition of claim 1, wherein the at least one abrasive particle comprises a material selected from a group consisting of alumina, ceria, germania, silica, spinel, titania, an oxide of tungsten, zirconia, and any combination thereof.

11. The composition of claim 1, wherein the at least one abrasive particle comprises silica.

12. The composition of claim 1, wherein the at least one abrasive particle comprises a metal oxide produced by a process selected from a group consisting of a sol-gel process, a precipitation process, and any combination thereof.

13. The composition of claim 1, wherein the at least one abrasive particle comprises a resinous particle.

14. The composition of claim 1, wherein the at least one abrasive particle comprises a material selected from a group consisting of a polyacrylic acid, a polymethylacrylic acid, a polymelamine, a particle of an ion exchange resin, and any combination thereof.

15. The composition of claim 1, wherein the at least one abrasive particle comprises a plastic particle.

16. The composition of claim 1, wherein the at least one abrasive particle comprises a material selected from a group consisting of a polyacrylic acid, a polymethylacrylic acid, a polyvinyl alcohol, and any combination thereof.

17. The composition of claim 1, wherein an effective diameter of the at least one abrasive particle is from about 30 to about 170 nanometers.

18. The composition of claim 1, wherein the at least one abrasive particle and the catalyst in physical connection therewith together are in an amount of from about 0.01 to about 6 weight percent relative to the composition.

19. The composition of claim 1, wherein the at least one abrasive particle and the catalyst in physical connection therewith together are in an amount of from about 0.01 to about 20 weight percent relative to the composition.

20. The composition of claim 1, wherein the at least one abrasive particle and the catalyst in physical connection therewith together are in an amount of from about 0.01 to about 10 weight percent relative to the composition.

21. The composition of claim 1, wherein the source is in a form selected from a group consisting of an acetate, a nitrate, a halide, a perchlorate, and any combination thereof.

22. The composition of the claim 1, wherein the metal is selected from the group consisting of iron, copper, and combination thereof.

23. The composition of claim 1, wherein the metal is selected from the group consisting of cobalt, nickel, and any combination thereof.

24. The composition of claim 1, wherein the metal is silver.

25. The composition of claim 1, wherein the metal is iron and the at least one abrasive particle comprises silica.

26. The composition of claim 1, wherein the catalyst is in physical connection with from about 5 to about 100 percent of the surface of the at least one abrasive particle.

27. The composition of claim 1, wherein the catalyst is in physical connection with from about 5 to about 80 percent of the surface of the at least one abrasive particle.

28. The composition of claim 1, wherein the catalyst is in physical connection with from about 25 to about 50 percent of the surface of the at least one abrasive particle.

29. The composition of claim 1, wherein the catalyst and the oxidizing agent are capable of interacting to generate free radicals.

30. The composition of claim 1, wherein the free radicals comprises hydroxyl free radicals.

31. The composition of claim 1, further comprising at least one other abrasive that is free of a physical connection with catalyst.

32. The composition of claim 21, wherein the other abrasive is in an amount of from about 0.01 to about 30 weight percent relative to the composition.

33. The composition of claim 1, wherein the other abrasive is in an amount of from about 0.01 to about 20 weight percent relative to the composition.

34. The composition of claim 1, wherein the other abrasive is in an amount of from about 0.01 to about 10 weight percent relative to the composition.

35. The composition of claim 1, further comprising an additive selected from a group consisting of a polish-enhancement agent, a stabilization agent, a surfactant, a dispersion agent, a pH-adjusting agent, and any combination thereof.

36. The composition of claim 35, wherein the additive is present in an amount of from about 0.001 to about 2 weight percent relative to the composition.

37. The composition of claim 1, wherein a pH of the composition is from about 2 to about 11.

38. The composition of claim 1, wherein a pH of the composition is from about 2 to about 8.

39. A composition for chemical-mechanical polishing, comprising:
at least one oxidizing agent;
at least one abrasive particle; and
a catalyst, wherein the catalyst is a source of an ion of a metal, wherein the metal ion is selected from the group consisting of copper, iron, nickel, silver and any combination thereof, and further wherein there is a physical connection between the metal ion and at least a portion of the surface of the abrasive particle.

40. A method of polishing a substrate surface having at least one feature thereon comprising a metal, comprising:
providing the composition of claim 1; and
chemical-mechanical polishing the feature with the composition.

41. The method of claim 40, wherein said providing comprises combining the at least one abrasive particle, there being a physical connection between the catalyst and at least a portion of the abrasive particle, with a prepared composition, the prepared composition comprising the oxidizing agent and being free of a catalyst-associated abrasive.

42. The method of claim 40, wherein the metal of the feature is selected from a group consisting of aluminum, copper, titanium, tungsten, any alloy thereof, and any combination thereof.

43. The method of claim 40, wherein the feature is adjacent a material selected from a group consisting of tantalum, tantalum nitride, titanium, titanium nitride, titanium tungsten, tungsten, and any combination thereof.

44. The method of claim 40, wherein the chemical-mechanical polishing comprises applying a pressure of from about 1 to about 6 pounds per square inch to the feature.

45. A composition for chemical-mechanical polishing, comprising:
at least one oxidizing agent;
at least one abrasive particle; and
a catalyst comprising a material selected from a group consisting of a metal acetate, a metal nitrate, a metal halide, a metal perchlorate, and any combination thereof, the metal thereof being selected from a group consisting of copper, nickel, iron, silver, and any combination thereof, there being a physical connection between the catalyst and at least a portion of the abrasive particle.

46. A composition for chemical-mechanical polishing, comprising:
at least one oxidizing agent;
at least one abrasive particle; and
a catalyst, wherein the catalyst is a source of an ion of a metal, wherein the metal ion is selected from the group consisting of copper, iron, nickel, silver and any combination thereof, and further wherein there is a physical connection between the metal ion and at least a portion of the surface of the abrasive particle, and the catalyst and the oxidizing agent are capable of interacting to generate free radicals.

47. The composition of claim 46, wherein the free radicals comprise hydroxyl free radicals.

48. The composition of any of claims 45 and 46, wherein the oxidizing agent comprises a per compound.

49. The composition of any of claims 45 and 46, wherein the oxidizing agent comprises ozone.

50. The composition of any of claims 45 and 46, wherein the oxidizing agent comprises an agent selected from a group consisting of a metal salt, a metal complex, and any combination thereof.

51. The composition of any of claims 45 and 46, wherein the oxidizing agent is selected from a group consisting of hydroxylamine, a salt of hydroxylamine, and any combination thereof.

52. The composition of any of claims 45 and 46, wherein the oxidizing agent is in an amount of from about 0.01 to about 6 weight percent relative to the composition.

53. The composition of any of claims 45 and 46, wherein the at least one abrasive particle comprises a material selected from a group consisting of alumina, ceria, germania, silica, spinel, titania, an oxide of tungsten, zirconia, and any combination thereof.

54. The composition of any of claims 45 and 46, wherein the at least one abrasive comprises silica.

55. The composition of any of claims 45 and 46, wherein the at least one abrasive particle comprises a material selected from a group consisting of a polyacrylic acid, a polymethalacrylic acid, a polyvinyl alcohol, a polymelamine, a particle of an ion exchange resin, and any combination thereof.

56. The composition of any of claims 45 and 46, wherein an effective diameter of the at least one abrasive particle is from about 30 to about 170 nanometers.

57. The composition of any of claims 45 and 46, wherein the at least one abrasive particle comprises aggregated or agglomerated particles.

58. The composition of any of claims 45 and 46, wherein the catalyst comprises a material selected from iron acetate, copper acetate, and any combination thereof.

59. The composition of any of claims 45 and 46, wherein the catalyst is in physical connection with from about 5 to about 80 percent of the surface of the abrasive particle.

60. The composition of any of claims 45 and 46, wherein the catalyst is in physical connection with from abut 25 to about 50 percent of the surface of the abrasive particle.

61. The composition of any of claims 45 and 46, wherein the catalyst is substantially insoluble in the composition.

62. The composition of claim 45, wherein the catalyst and the oxidizing agent are capable of interacting to generate free radicals.

63. The composition of claim 62, wherein the free radicals comprise hydroxyl free radicals.

64. The composition of any of claims 45 and 46, wherein the at least one abrasive particle and the catalyst are in physical connection therewith together are in an amount of from about 0.01 to about 10 weight percent relative to the composition.

65. The composition of any of claims 45 and 46, wherein the at least one abrasive particle and the catalyst in physical connection therewith together are in an amount of about 0.5 weight percent relative to the composition.

66. The composition of any of claims 45 and 46, the physical connection selected from a group consisting of a formation of at least a particle layer of the catalyst on at least a portion of the abrasive, an absorption of the catalyst on at least a portion of the abrasive, an adsorption of the catalyst on at least a portion of the abrasive, and an adhesion of the catalyst on at least a portion of the abrasive.

67. The composition of any of claims 45 and 46, the physical connection sufficient to remain substantially intact during chemical-mechanical polishing.

68. The composition of any of claims 45 and 46, the physical connection sufficient such that the catalyst is not free in the composition.

69. The composition of any of claims 45 and 46, the physical connection sufficient such that the metal is not free in the composition.

70. The composition of any of claims 45 and 46, further comprising at least one free abrasive that is free of a physical connection with catalyst.

71. The composition of claim 70, wherein the free abrasive is in an amount of from about 0.01 to about 10 weight percent relative to the composition.

72. The composition of any of claims 45 and 46, further comprising a free catalyst that is free in the composition in an amount sufficient to avoid destabilization of the composition.

73. The composition of any of claims 45 and 46, further comprising a free catalyst that is free in the composition in an amount sufficient to avoid degradation of the oxidizing agent.

74. The composition of any of claims 45 and 46, further comprising an additive selected from a group consisting of a polish-enhancement agent, a stabilization agent, a surfactant, a dispersion agent, a pH-adjusting agent, and any combination thereof.

75. The composition of claim 74, wherein the additive is present in an amount of from about 0.001 to about 2 weight percent relative to the composition.

76. The composition of any of claims 45 and 46, wherein a pH of the composition is from about 2 to about 8.

77. The composition of any of claims 45 and 46, the composition sufficient for chemical-mechanical polishing of a substrate surface having a feature thereon comprising a first material selected from a group consisting of aluminum, copper, titanium, tungsten, any alloy thereof, and any combination thereof.

78. The composition of claim 77, the composition sufficient for chemical-mechanical polishing of the substrate surface comprising a second material adjacent the feature, the second material selected from a group consisting of tantalum, tantalum nitride, titanium, titanium nitride, titanium tungsten, tungsten, and any combination thereof.

79. A method of polishing a substrate surface having at least one feature thereon comprising a metal, comprising:
providing the composition of any one of claims 45 and 46; and
chemical-mechanical polishing the feature with the composition.

80. The method of claim 79, wherein the metal of the feature is selected from a group consisting of aluminum, copper, titanium, tungsten, any alloy thereof, and any combination thereof.

81. The method of claim 79, wherein the feature is adjacent a material selected from a group consisting of tantalum, tantalum nitride, titanium, titanium nitride, titanium tungsten, tungsten, and any combination thereof.

82. The method of claim 79, wherein the chemical-mechanical polishing comprises applying a pressure of from about 1 to about 6 pounds per square inch to the feature.

83. The method of claim 79, said method sufficient to provide the substrate surface with about zero to about 12 percent within-wafer nonuniformity.

84. The composition of claim 1, wherein the at least one abrasive particle comprises silica produced by a process selected from a group consisting of a hydrothermal process, a plasma process, a fuming process, and any combination thereof.

85. The composition of claim 10, wherein the at least one abrasive particle is alumina.

86. The composition of claim 10, wherein the at least one abrasive particle is titania.

87. A method of polishing a substrate surface having at least one feature thereon comprising a metal, comprising:
providing the composition of claim 39; and
chemical-mechanical polishing the feature with the composition.

88. A composition for chemical-mechanical polishing, comprising:
at least one oxidizing agent;
at least one abrasive particle; and
a catalyst, wherein the catalyst is a source of an ion of a metal, wherein the metal ion is selected from the group consisting of metals in Group 1(b) and Group 8 and any combination thereof, and further wherein there is a physical connection between the metal ion and at least a portion of the surface of the abrasive particle.

89. A method of polishing a substrate surface having at least one feature thereon comprising a metal, comprising:
providing the composition of claim 88; and
chemical-mechanical polishing the feature with the composition.

90. A composition for chemical-mechanical polishing, comprising:
at least one oxidizing agent;
at least one abrasive particle; and a catalyst comprising a source of an ion of a metal, wherein the source is in a form selected from a group consisting of an acetate, a nitrate, a halide, a perchlorate, and any combination thereof, wherein the metal is other than a metal of Group 4(b), Group 5(b), or Group 6(b), there being a physical connection between the catalyst and at least a portion of the abrasive particle.

91. The composition of claim 88, where the metal has a standard oxidation potential of from about −0.52 to about −0.25 eV.

92. The composition of claim 88, where the metal has a standard oxidation potential of from about −0.5 to about −0.4 eV.

* * * * *